(12) United States Patent
Hayashi et al.

(10) Patent No.: US 8,536,061 B2
(45) Date of Patent: Sep. 17, 2013

(54) SEMICONDUCTOR DEVICE MANUFACTURING METHOD

(75) Inventors: Hisataka Hayashi, Yokohama (JP); Yusuke Kasahara, Yokohama (JP); Tsubasa Imamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/045,818

(22) Filed: Mar. 11, 2011

(65) Prior Publication Data

US 2012/0034785 A1 Feb. 9, 2012

(30) Foreign Application Priority Data

Aug. 5, 2010 (JP) ................................. 2010-176649

(51) Int. Cl.
*H01L 21/306* (2006.01)
(52) U.S. Cl.
USPC ...... 438/719; 438/723; 438/724; 257/E21.22; 216/63; 216/67; 216/79
(58) Field of Classification Search
None
See application file for complete search history.

(56) References Cited

U.S. PATENT DOCUMENTS

| | | | | | |
|---|---|---|---|---|---|
| 4,211,601 | A | * | 7/1980 | Mogab | 438/719 |
| 4,226,665 | A | * | 10/1980 | Mogab | 438/710 |
| 4,260,649 | A | * | 4/1981 | Dension et al. | 427/582 |
| 4,344,816 | A | * | 8/1982 | Craighead et al. | 216/66 |
| 4,374,698 | A | * | 2/1983 | Sanders et al. | 438/724 |
| 4,431,477 | A | * | 2/1984 | Zajac | 438/719 |
| 4,572,759 | A | * | 2/1986 | Benzing | 156/345.45 |
| 4,595,453 | A | * | 6/1986 | Yamazaki et al. | 438/718 |
| 4,672,410 | A | * | 6/1987 | Miura et al. | 257/302 |
| 4,673,962 | A | * | 6/1987 | Chatterjee et al. | 257/68 |
| 4,678,539 | A | * | 7/1987 | Tomita et al. | 438/724 |
| 4,717,447 | A | * | 1/1988 | Dieleman et al. | 438/724 |
| 4,734,152 | A | * | 3/1988 | Geis et al. | 216/45 |
| 4,786,359 | A | * | 11/1988 | Stark et al. | 438/710 |
| 4,855,017 | A | * | 8/1989 | Douglas | 438/695 |
| 4,983,253 | A | * | 1/1991 | Wolfe et al. | 438/719 |
| 5,007,982 | A | * | 4/1991 | Tsou | 438/585 |
| 5,102,817 | A | * | 4/1992 | Chatterjee et al. | 438/242 |

(Continued)

FOREIGN PATENT DOCUMENTS

| JP | 58-100684 | 6/1983 |
|---|---|---|
| JP | 05-152255 | 6/1993 |

(Continued)

OTHER PUBLICATIONS

First Office Action issued by the Japanese Patent Office on May 21, 2013, for corresponding Japanese Patent Application No. 2010-176649.

*Primary Examiner* — Allan Olsen
(74) *Attorney, Agent, or Firm* — Finnegan, Henderson, Farabow, Garrett & Dunner, LLP

(57) ABSTRACT

According to one embodiment, a semiconductor device manufacturing method includes collectively etching layers of a multilayered film including silicon layers and silicon oxide films alternately stacked on a semiconductor substrate. The etching gas of the etching contains at least two types of group-VII elements and one of a group-III element, a group-IV element, a group-V element, and a group-VI element, the energy of ions entering the semiconductor substrate when performing the etching is not less than 100 eV, and an addition ratio of the group-III element, the group-IV element, the group-V element, the group-VI element, and the group-VII element to the group-VII element is 0.5 (inclusive) to 3.0 (inclusive).

14 Claims, 10 Drawing Sheets

(56) References Cited

U.S. PATENT DOCUMENTS

| | | | | |
|---|---|---|---|---|
| 5,254,213 | A * | 10/1993 | Tamaki | 438/637 |
| 5,290,383 | A * | 3/1994 | Koshimizu | 156/345.25 |
| 5,322,590 | A * | 6/1994 | Koshimizu | 438/9 |
| 5,419,805 | A * | 5/1995 | Jolly | 438/715 |
| 5,422,295 | A * | 6/1995 | Choi et al. | 438/254 |
| 5,431,772 | A * | 7/1995 | Babie et al. | 438/714 |
| 5,494,840 | A * | 2/1996 | Ohmi | 438/253 |
| 5,498,312 | A * | 3/1996 | Laermer et al. | 438/695 |
| 5,503,901 | A * | 4/1996 | Sakai et al. | 438/723 |
| 5,534,107 | A * | 7/1996 | Gray et al. | 438/708 |
| 5,618,760 | A * | 4/1997 | Soh et al. | 438/703 |
| 5,620,930 | A * | 4/1997 | Hey et al. | 438/421 |
| 5,698,070 | A * | 12/1997 | Hirano et al. | 438/729 |
| 5,725,785 | A * | 3/1998 | Ishida et al. | 216/2 |
| 5,830,807 | A * | 11/1998 | Matsunaga et al. | 438/714 |
| 5,866,448 | A * | 2/1999 | Pradeep et al. | 438/231 |
| 6,020,270 | A * | 2/2000 | Wong et al. | 438/719 |
| 6,093,943 | A * | 7/2000 | Ikemasu et al. | 257/306 |
| 6,096,389 | A * | 8/2000 | Kanai | 427/575 |
| 6,177,147 | B1 * | 1/2001 | Samukawa et al. | 427/569 |
| 6,190,961 | B1 * | 2/2001 | Lam et al. | 438/253 |
| 6,270,948 | B1 * | 8/2001 | Sato et al. | 430/314 |
| 6,325,676 | B1 * | 12/2001 | Jung et al. | 439/719 |
| 6,383,938 | B2 * | 5/2002 | Pandhumsoporn et al. | 438/706 |
| 6,426,524 | B1 * | 7/2002 | Lam et al. | 257/296 |
| 6,670,105 | B2 * | 12/2003 | Terada et al. | 430/320 |
| 6,806,021 | B2 * | 10/2004 | Sato et al. | 430/198 |
| 6,921,725 | B2 * | 7/2005 | Donohoe | 438/723 |
| 6,969,568 | B2 * | 11/2005 | Rauf et al. | 430/5 |
| 7,897,516 | B1 * | 3/2011 | Kinder et al. | 438/695 |
| RE42,955 | E * | 11/2011 | Gunter et al. | 438/347 |
| 2001/0027024 | A1 * | 10/2001 | Murase | 438/706 |
| 2003/0216031 | A1 * | 11/2003 | Komagata | 438/636 |
| 2004/0035825 | A1 * | 2/2004 | Nakamura et al. | 216/67 |
| 2004/0096163 | A1 * | 5/2004 | Colgan et al. | 385/59 |
| 2006/0148156 | A1 * | 7/2006 | Gunter et al. | 438/199 |
| 2007/0193602 | A1 * | 8/2007 | Savas et al. | 134/1.1 |
| 2008/0265259 | A1 * | 10/2008 | Gunter et al. | 257/76 |
| 2009/0162950 | A1 * | 6/2009 | Kuboi et al. | 438/5 |
| 2010/0167507 | A1 * | 7/2010 | Horigome et al. | 438/513 |
| 2011/0269290 | A1 * | 11/2011 | Kasahara et al. | 438/382 |

FOREIGN PATENT DOCUMENTS

| | | |
|---|---|---|
| JP | 05-343362 | 12/1993 |
| JP | 06-267907 | 9/1994 |
| JP | 2002-016050 | 1/2002 |

* cited by examiner

Manufacturing Method

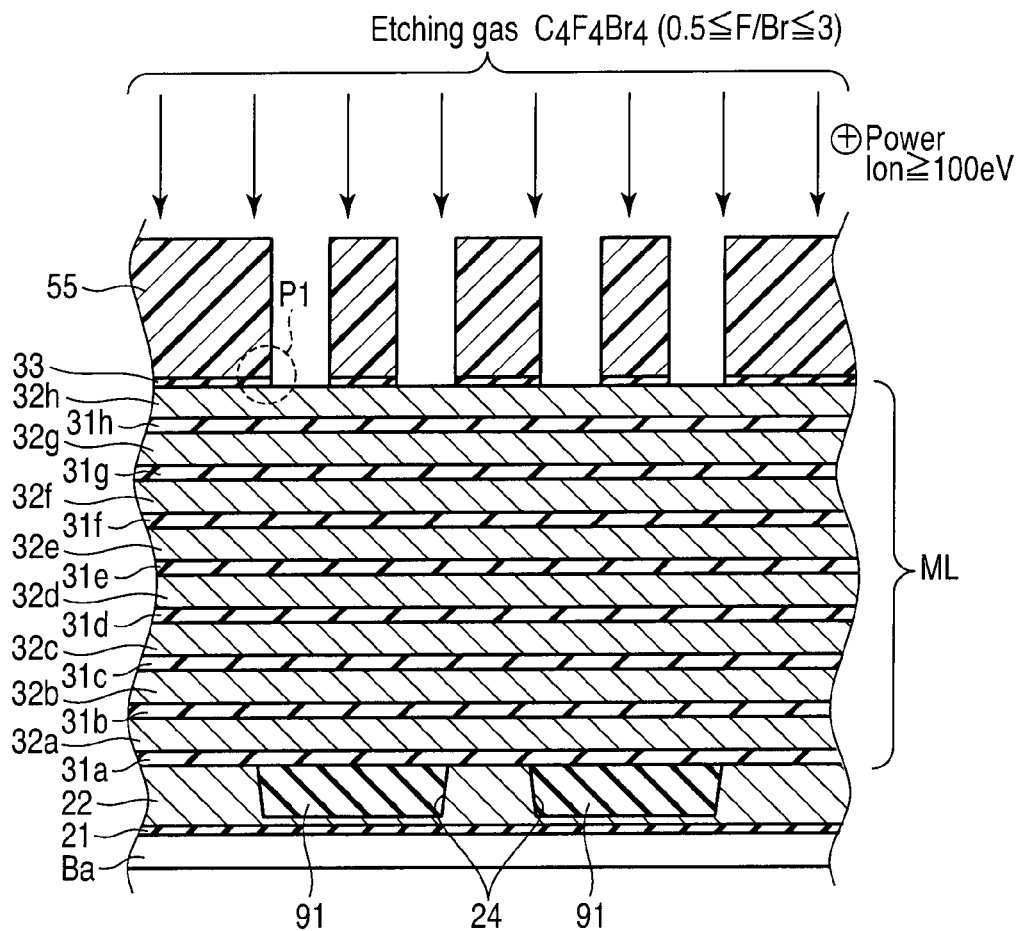
F I G. 7

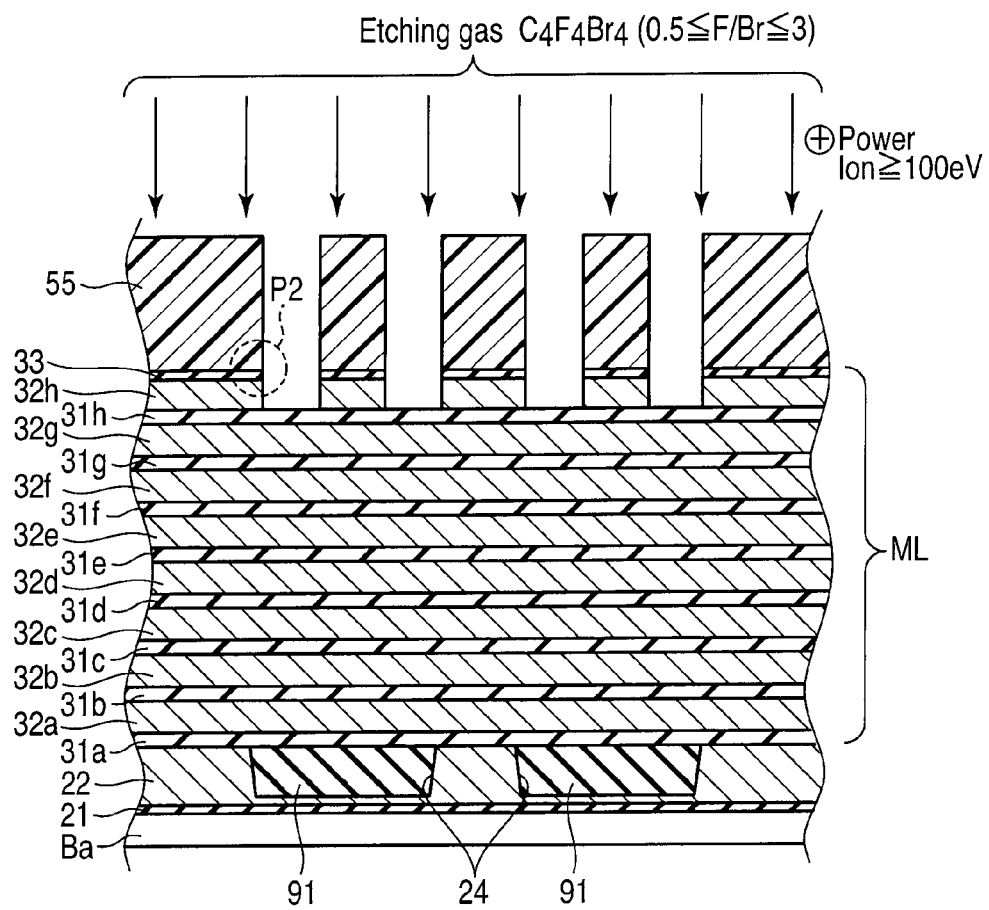
F I G. 9

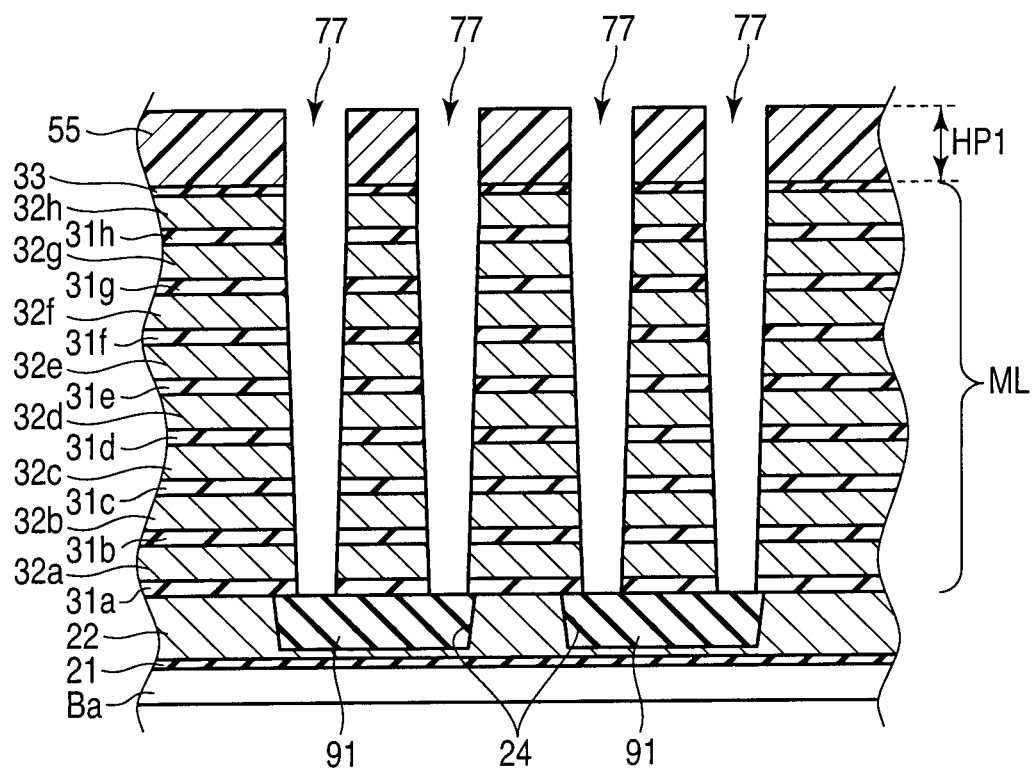
F I G. 11

US 8,536,061 B2

SEMICONDUCTOR DEVICE MANUFACTURING METHOD

CROSS-REFERENCE TO RELATED APPLICATIONS

This application is based upon and claims the benefit of priority from Japanese Patent Application No. 2010-176649, filed Aug. 5, 2010; the entire contents of which are incorporated herein by reference.

FIELD

Embodiments described herein relate generally to, e.g., a semiconductor device manufacturing method.

BACKGROUND

When etching a silicon oxide film ($SiO_2$) as a typical insulating material of a semiconductor device in a plasma ambient by dry etching, for example, a gas mixture mainly containing a carbon fluoride compound is often used. When forming a contact hole in $SiO_2$, a gas mixture obtained by adding $O_2$ and an inert gas to a carbon fluoride compound having a high carbon ratio such as $C_4F_8$ is used. Consequently, a high selectivity of, e.g., 10 is obtained against silicon (Si).

On the other hand, when etching silicon (Si) in a plasma ambient, a gas mixture mainly containing hydrogen bromide is often used. When forming an Si trench by using $SiO_2$ as a mask, a gas mixture of HBr and $O_2$ is used. As a consequence, a high selectivity of, e.g., 90 is obtained against $SiO_2$.

BRIEF DESCRIPTION OF THE DRAWINGS

FIG. 7 is a sectional view showing still another manufacturing step of the semiconductor memory according to the embodiment;

FIG. 9 is a sectional view showing still another manufacturing step of the semiconductor memory according to the embodiment;

FIG. 11 is a sectional view showing still another manufacturing step of the semiconductor memory according to the embodiment.

DETAILED DESCRIPTION

Figure 1:
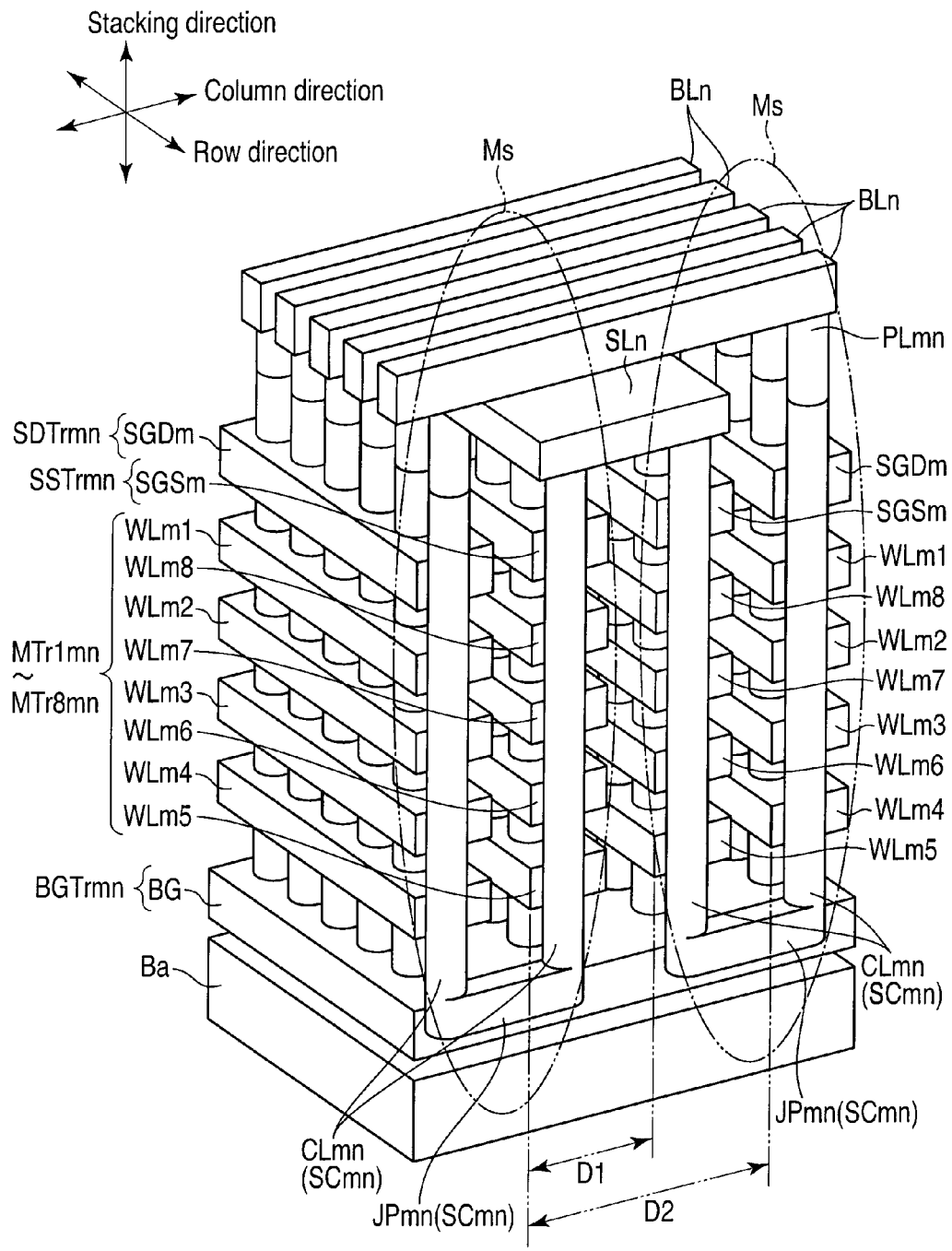
FIG. 1 is a perspective view showing a configuration example of a semiconductor memory according to an embodiment.

In general, according to one embodiment, a semiconductor device manufacturing method includes collectively etching layers of a multilayered film including silicon layers and silicon oxide films alternately stacked on a semiconductor substrate. The etching gas of the etching contains at least two types of group-VII elements and a group-III, group-IV, group-V, or group-VI element, the energy of ions entering the semiconductor substrate when performing the etching is 100 eV or more, and the addition ratio of the group-III to group-VII elements to the group-VII element is 0.5 (inclusive) to 3.0 (inclusive).

When collectively etching layers of a structure formed by stacking $SiO_2$ and Si, a gas mixture of a carbon fluoride compound and carbon bromide compound is used as an etching gas. Since the carbon fluoride compound mainly contributes to etching of $SiO_2$ and hydrogen bromide mainly contributes to etching of Si, the etching rate does not rise in many cases.

In addition, a photoresist of a photosensitive organic film used in a photolithography step is used as an etching mask for the base material. When etching the base material by dry etching, the photoresist is damaged by ultraviolet light, ions, and radicals emitted from a plasma ambient. Therefore, the photoresist is twisted or bent, and affects the shape of the base etching material. This often deteriorates the reliability.

Recently, a semiconductor memory obtained by three-dimensionally stacking memory cells is attracting attention. A three-dimensional semiconductor memory like this presumably requires the step of collectively etching layers of a multilayered film including silicon layers and silicon oxide films alternately stacked on a semiconductor substrate.

Accordingly, an embodiment will be explained below with reference to the accompanying drawing. Note that the embodiment will be explained by taking, as an example, a semiconductor memory in which memory cells are three-dimensionally stacked on a semiconductor substrate, but the present invention is not limited to this embodiment. In the following explanation, the same reference numerals denote the same parts throughout the drawing.

Embodiment

1. Configuration Example

First, a configuration example of a semiconductor memory according to this embodiment will be explained below with reference to FIGS. 1, 2, and 3.

1-1. Configuration Example of Memory Cell Region

FIG. 1 is a perspective view schematically showing a part of a memory cell region of a nonvolatile semiconductor memory according to this embodiment.

In this embodiment as shown in FIG. 1, the memory cell region includes m×n (m and n are natural numbers) memory strings MS each including memory cell transistors MTr1$mn$ to MTr8$mn$, a source-side selection transistor SSTrmn, and a drain-side selection transistor SDTrmn. In this example, m=6 and n=2.

In the memory cell region, the plurality of memory strings MS are formed. As will be described in detail later, each memory string MS is formed by connecting a plurality of electrically programmable memory cell transistors MTrmn in series, and each memory cell transistor Mtrmn is formed by stacking a plurality of semiconductor layers.

Each memory string MS includes a U-shaped semiconductor SCmn, word lines WLmn (WLm1 to WLm8), a source-side selection gate line SGSm, a drain-side selection gate line SGDm, and a back gate line BG.

The U-shaped semiconductor SCmn is formed into a U-shape when viewed in the row direction. The U-shaped semiconductor SCmn includes a pair of columnar portions CLmn extending in a direction almost perpendicular to a semiconductor substrate Ba, and a joint portion JPmn formed to connect the lower ends of the pair of columnar portions CLmn. The U-shaped semiconductor SCmn also includes a hollow H1 extending from the upper end of one columnar portion CLmn to that of the other columnar portion CLmn via the joint portion JPmn.

The word line WLmn in each layer has a shape extending parallel to the row direction.

The gates of the memory cell transistors MTr1$mn$ to MTr8$mn$ formed in the same position in the column direction and arranged in the row direction are connected to the same word line WLmn. Each word line WLmn is almost perpendicular to the memory string MS.

Although not shown in FIG. 1, an interlayer dielectric film made of a silicon oxide film or the like is formed between the above-mentioned components to electrically insulate them.

Accordingly, the pair of columnar portions CLmn, for example, are formed by collectively etching layers of a multilayered film including the word lines WL formed by silicon oxide films and polysilicon (poly-Si) layers alternately stacked on a semiconductor substrate. Details will be described later.

1-2. Configuration Example of Memory String

Figure 2:
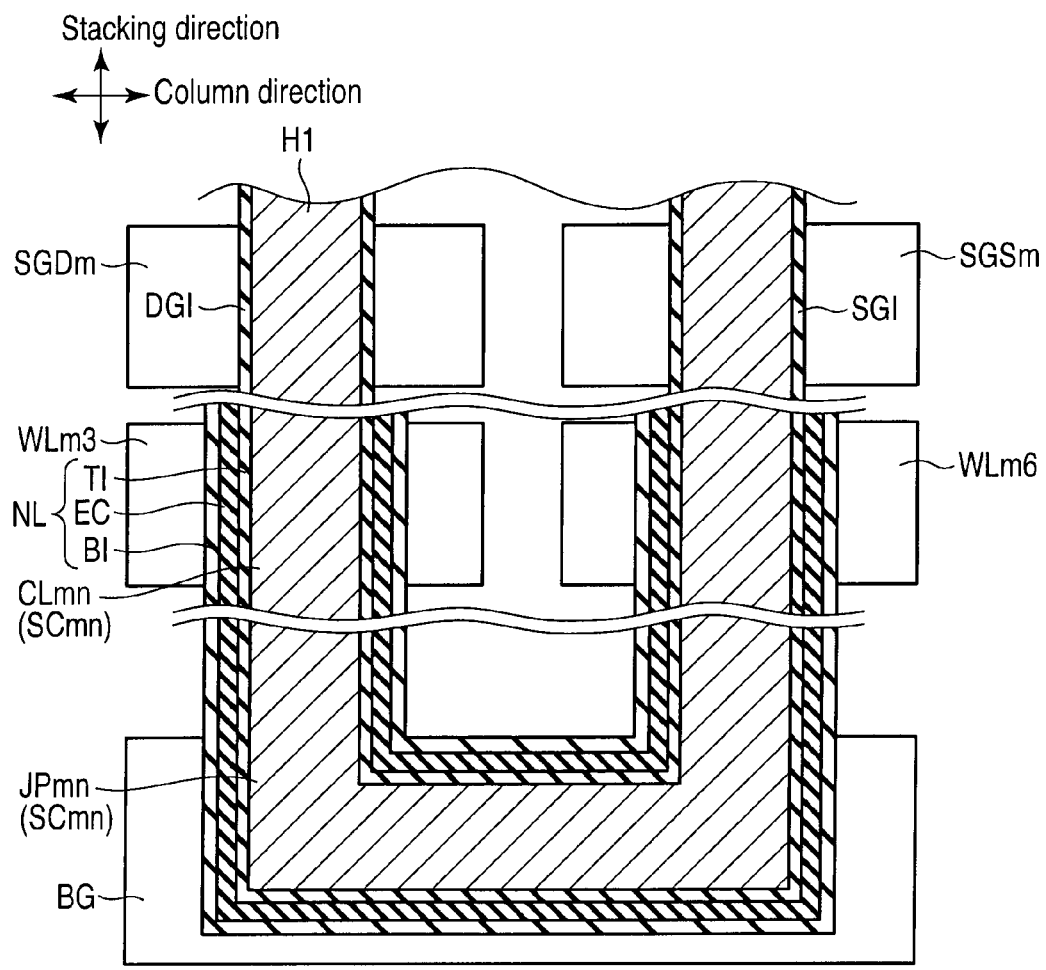
FIG. 2 is a sectional view showing a configuration example of a memory string shown in FIG. 1.

FIG. 2 is a sectional view showing a portion of the memory string MS shown in FIG. 1 in an enlarged scale.

As shown in FIG. 2, an ONO (Oxide-Nitride-Oxide) layer NL is formed between the word line WLmn and columnar portion CLmn. The ONO layer NL includes a tunnel insulating layer TI in contact with the columnar portion CLmn, a charge storage layer EC in contact with the tunnel insulating layer TI, and a block insulating layer BI in contact with the charge storage layer EC. The charge storage layer EC has a function of storing electric charge.

The drain-side selection gate line SGDm is formed above the uppermost word line WLmn, and has a shape extending parallel to the row direction.

The source-side selection gate line SGSm is formed above the uppermost word line WLmn, and has a shape extending parallel to the row direction.

A gate insulating layer DGI is formed between the drain-side selection gate line SGDm and columnar portion CLmn. A gate insulating layer SGI is formed between the source-side selection gate line SGSm and columnar portion CLmn.

The back gate line BG is formed to two-dimensionally spread in the row and column directions so as to cover the lower portions of the plurality of joint portions JPmn. As shown in FIG. 2, the above-described ONO layer NL is formed between the back gate line BG and joint portion JPmn.

A source line SLn is formed on the upper ends of the columnar portions CLmn of the U-shaped semiconductors SCmn adjacent to each other in the column direction.

Bit lines BLn are formed on plug lines PLmn on the upper ends of the columnar portions CLmn extending above the drain-side selection gate lines SGDm. Each bit line BLn is formed above the source line SL. The bit lines BLn are repetitively formed at predetermined intervals in the row direction, as lines extending in the column direction.

1-3. Equivalent Circuit of Memory String

Figure 3:
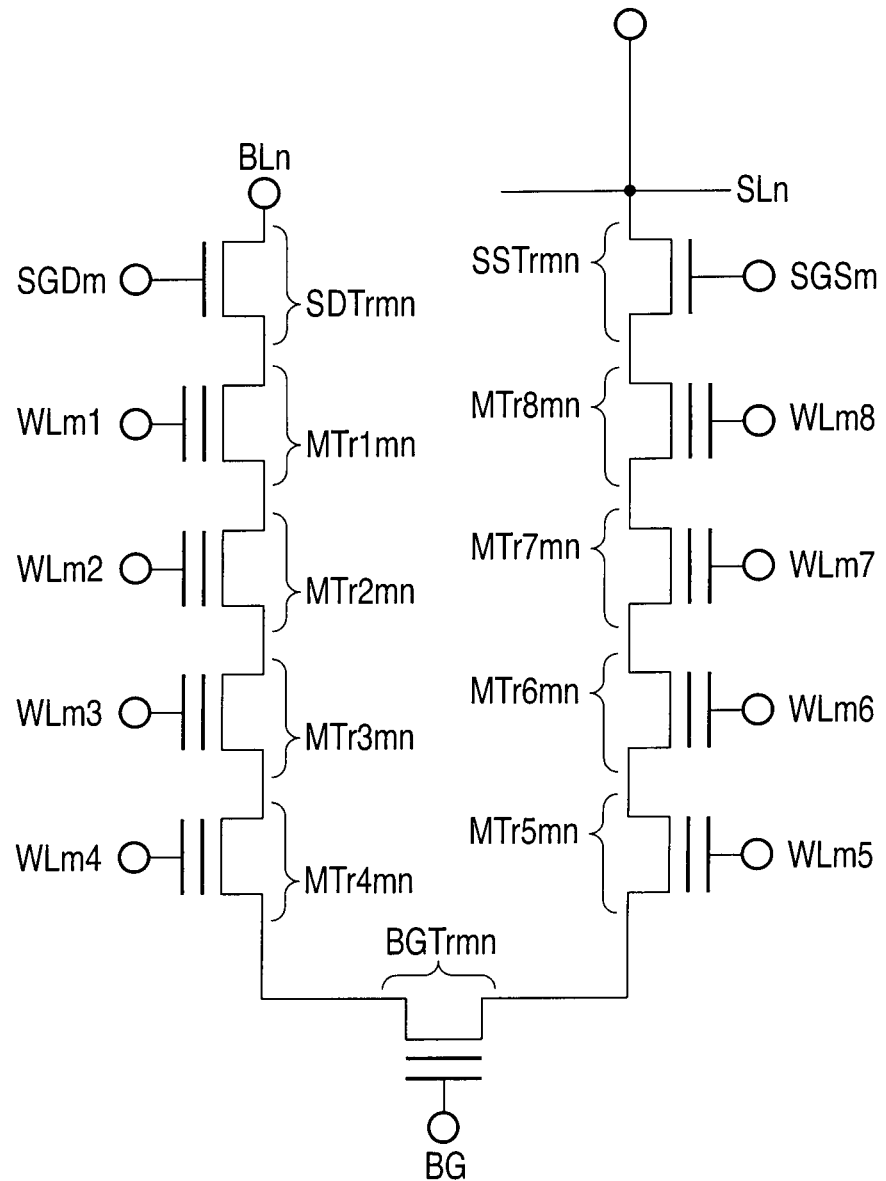
FIG. 3 is an equivalent circuit diagram of the memory string shown in FIG. 1.

FIG. 3 shows an equivalent circuit of the memory string according to this embodiment.

As shown in FIG. 3, each memory string MS includes the eight memory cell transistors MTr1$mn$ to MTr8$mn$, the source-side selection transistor SSTrmn, the drain-side selection transistor SDTrmn, and a back gate transistor BGTrmn.

The current paths of the eight memory cell transistors MTr1$mn$ to MTr8$mn$, source-side selection transistor SSTrmn, and drain-side selection transistor SDTrmn described above are connected in series.

A control circuit (not shown) is electrically connected to the source line SLn.

2. Manufacturing Method

A method of manufacturing the semiconductor memory according to this embodiment will be explained below with reference to FIGS. 4, 5, 6A, 6B, 7, 8, 9, 10, and 11. The memory cell region of the semiconductor memory explained with reference to FIGS. 1, 2, and 3 will be taken as an example.

Figure 4:
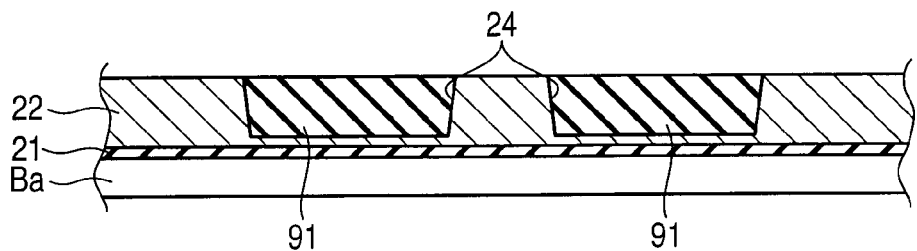
FIG. 4 is a sectional view showing a manufacturing step of the semiconductor memory according to the embodiment.

First, as shown in FIG. 4, an insulating film 21 is formed by depositing silicon oxide ($SiO_2$) on the semiconductor substrate Ba by using, e.g., thermal oxidation. Then, a back gate insulating film 22 is formed by depositing silicon oxide ($SiO_2$) on the insulating film 21 by the same method. Subsequently, a back gate conductive layer 22 is formed by depositing a polysilicon (poly-Si) layer on the back gate insulating film 22 by using, e.g., CVD (Chemical Vapor Deposition). After that, a sacrificial layer 91 is formed by depositing, e.g., a silicon nitride (SiN) film so as to fill back gate holes 24 formed by digging the back gate conductive layer 22.

Figure 5:
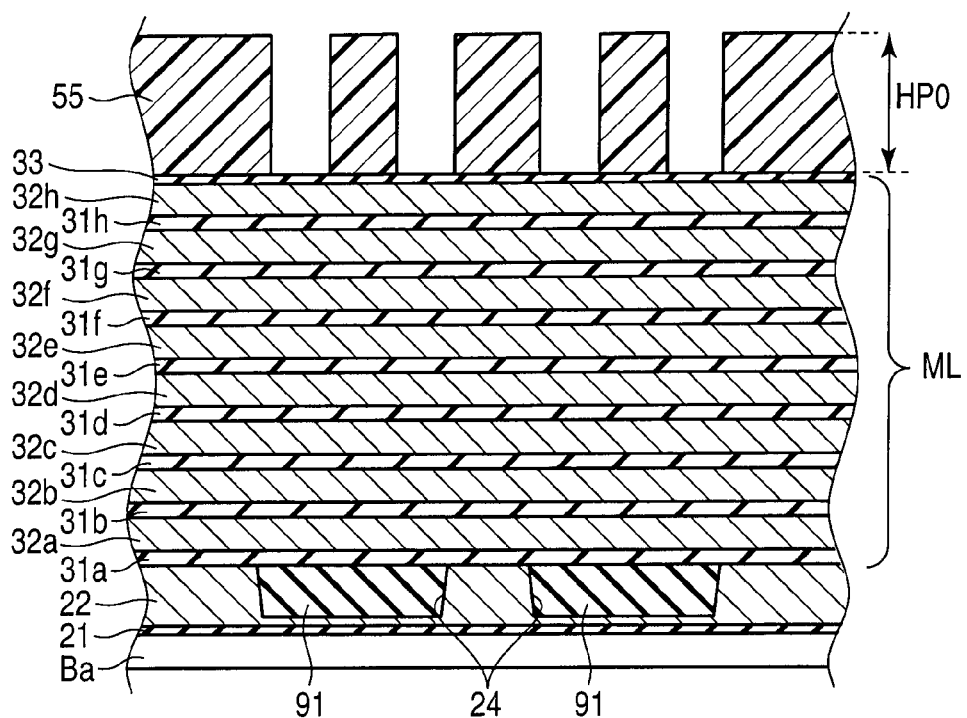
FIG. 5 is a sectional view showing another manufacturing step of the semiconductor memory according to the embodiment.

As shown in FIG. 5, silicon oxide ($SiO_2$) layers and polysilicon (poly-Si) layers are alternately sequentially stacked on the back gate conductive layer 22 and sacrificial layer 91 by using CVD or the like, thereby forming a multilayered film ML including plate-like insulating layers 31$a$ to 31$h$ and 33 and polysilicon layers 32$a$ to 32$h$.

On the insulating layer 33, a carbon film 55 having a height of about 1 μm is deposited. As the carbon film 55, it is possible to use, e.g., a spin-on carbon film, CVD (Chemical Vapor Deposition) carbon film, or PVD (Physical Vapor Deposition) carbon film. In the carbon film 55, holes for collectively etching the layers of the multilayered film ML including the insulating layers 31$a$ to 31$h$ and 33 and polysilicon layers 32$a$ to 32$h$ are formed.

Etching Gas

Figures 6A, 6B:
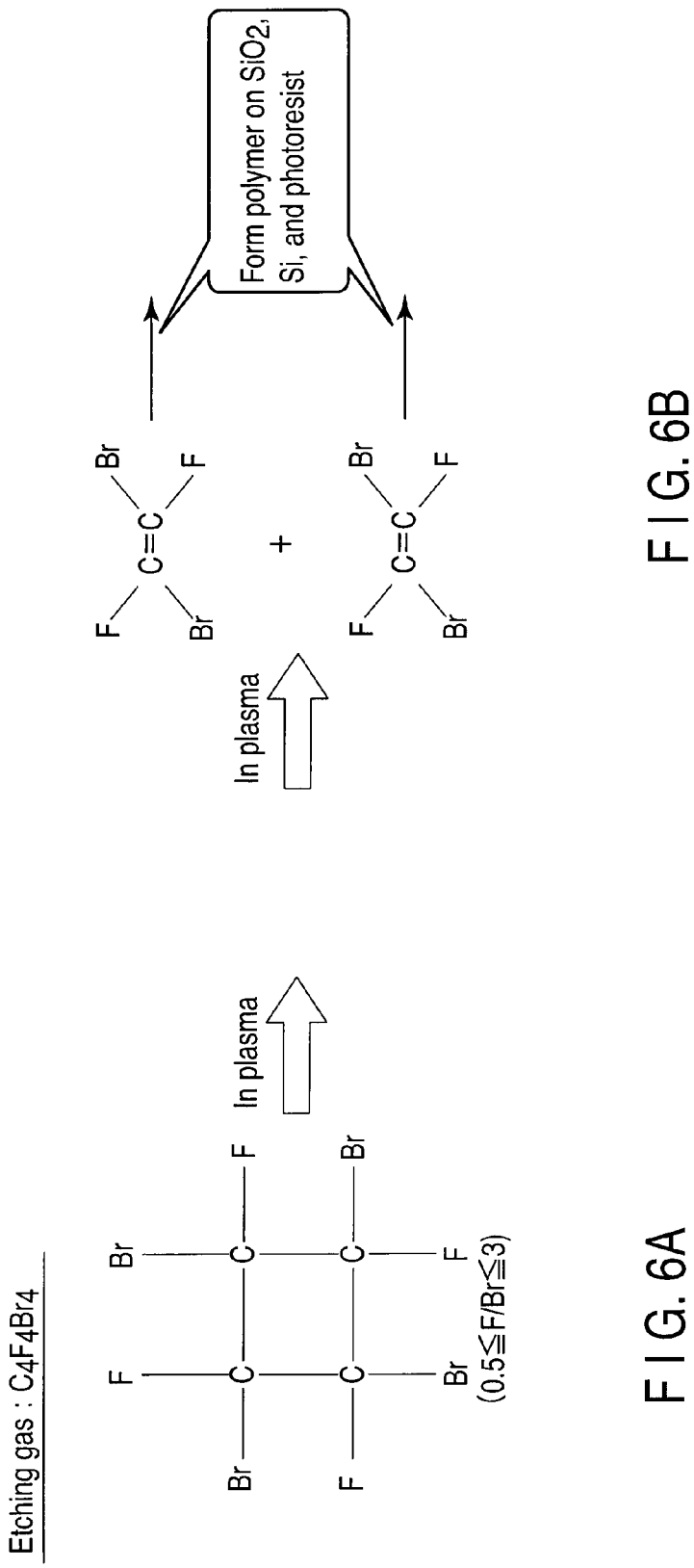
FIG. 6A is a view showing an etching gas according to the embodiment.
FIG. 6B is a view showing the etching gas in a plasma according to the embodiment.

Subsequently, an etching gas shown in FIGS. 6A and 6B is used to collectively etch the layers of the multilayered film ML by using the carbon film 55 as a mask.

As shown in FIG. 6A, this example uses $C_4F_4Br_4$ as an example of the etching gas. However, the etching gas is not limited to this, and it is only necessary to use an etching gas containing at least two types of group-VII elements and a group-III, group-IV, group-V, or group VI element.

The energy of ions entering the semiconductor substrate in the etching step is 100 eV or more.

The addition ratio of the group-III to group-VII elements (in this example, Br) to the group-VII element (in this example, F) is 0.5 (inclusive) to 3.0 (inclusive) (in this example, $0.5 \leq F/Br \leq 3.0$).

As shown in FIG. 6B, cyclic halogenated carbide-based gas $C_4F_4Br_4$ as the etching gas according to this example is readily dissociated in a plasma ambient in the etching step, thereby generating two halogenated carbide-based molecules containing a double bond shown in FIG. 6B.

The above-mentioned halogenated carbide-based molecules readily form a polymer on the surfaces of the etching base materials (silicon oxide ($SiO_2$) and polysilicon (poly-Si)) and on the photoresist.

Figure 8:
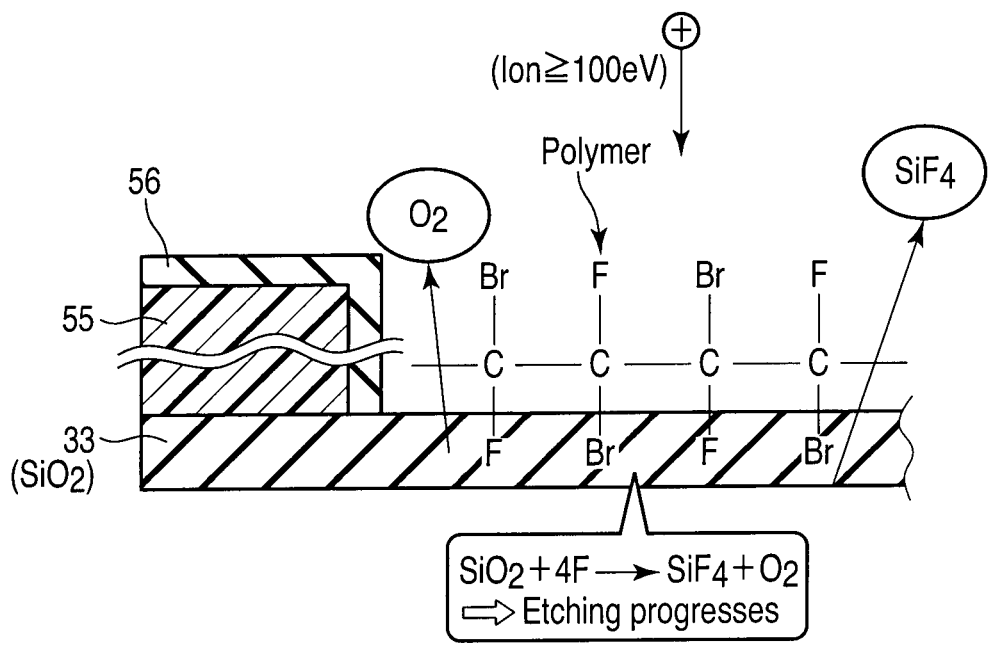
FIG. 8 is an exemplary view for explaining P1 ($SiO_2$ etching) shown in FIG. 7 in an enlarged scale.

Then, as shown in FIG. 7, the carbon film 55 is used as a mask to etch the uppermost insulating film (silicon oxide ($SiO_2$) film) 33 in the multilayered film ML by RIE (Reactive Ion Etching) using etching gas $C_4F_4Br_4$ ($0.5 \leqq F/Br \leqq 3.0$) shown in FIGS. 6A and 6B, while the energy of ions entering the semiconductor substrate is set at 100 eV or more. FIG. 8 shows a portion P1 enclosed with the broken line in FIG. 7.

As shown in FIG. 8, the halogenated carbide-based molecules containing a double bond, which are generated when etching gas $C_4F_4Br_4$ is dissociated in the plasma ambient in the RIE step, readily form a polymer on the insulating film (silicon oxide ($SiO_2$) 33 as an etching material and on the carbon film 55. This makes it possible to increase the reactivity to the etching material, and increase the etching rate.

More specifically, halogen (F) contained in the polymer reacts with the base material (silicon oxide ($SiO_2$)) of the insulating film ($SiO_2$) 33 as an etching material, and releases $O_2$ and $SiF_4$. As a consequence, the etching can be advanced. This reaction is represented by formula (1).

$$SiO_2 + 4F \rightarrow SiF_4 + O_2 \qquad \text{formula (1)}$$

In addition, the polymer formed on the carbon film 55 by the halogenated carbide-based molecules containing a double bond functions as a protective film (by CF and CBr) of the carbon film 55. In this etching step, therefore, the plasma damage to the carbon film 55 can be reduced.

Figure 10:
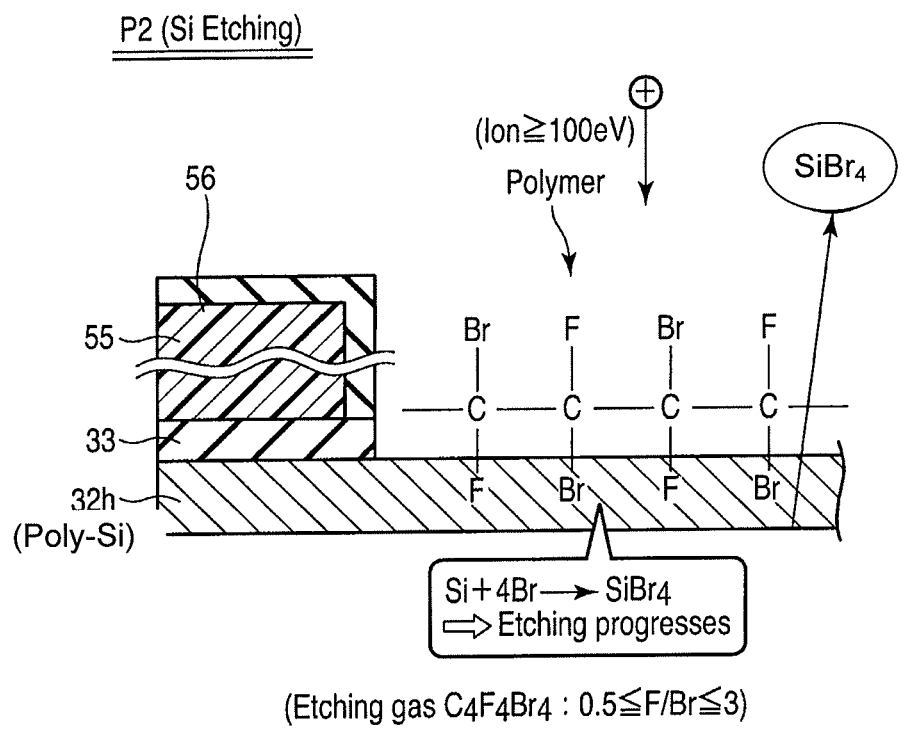
FIG. 10 is an exemplary view for explaining P2 (Si etching) shown in FIG. 8 in an enlarged scale.

Subsequently, as shown in FIG. 9, RIE using etching gas $C_4F_4Br_4$ ($0.5 \leqq F/Br, C \leqq 3.0$) is continued, and the carbon film 55 is used as a mask to etch the polysilicon (poly-Si) layer 32h in the multilayered film ML while the energy of ions entering the semiconductor substrate is set at 100 eV or more. FIG. 10 shows a portion P2 enclosed with the broken line in FIG. 9.

As shown in FIG. 10, the halogenated carbide-based molecules containing a double bond, which are generated by dissociation in the plasma ambient in the RIE step, readily form a polymer on the polysilicon (poly-Si) layer 32h as an etching material and on the photoresist 55. This makes it possible to increase the reactivity to the etching material, and increase the etching rate.

More specifically, halogen (Br) contained in the polymer reacts with the base material (poly-Si) of the polysilicon (poly-Si) layer 3h as an etching material, and releases $SiBr_4$. As a consequence, the etching can be advanced. This reaction is represented by formula (2).

$$Si + 4Br \rightarrow SiBr_4 \qquad \text{formula (2)}$$

In addition, as described above, the polymer formed on the photoresist 55 by the halogenated carbide-based molecules generated by dissociation in the plasma ambient and containing a double bond functions as a protective film (by CF and CBr) of the carbon film 55. In this etching step, therefore, the plasma damage to the carbon film 55 can be reduced.

As shown in FIG. 11, trenches 77 for forming the memory strings MS can simultaneously be formed by continuing the above-mentioned etching step to the surface of the sacrificial film 91. After the trenches 77 are formed by collectively etching the layers of the multilayered film ML, the height of the carbon film 55 is about 0.3 μm (<HP0). In this example, a height HP1 after the etching can be held high because the plasma damage to the photoresist 55 can be reduced in the etching step.

Subsequently, the sacrificial film 91 is removed. Then, a tunnel insulting layer TI, a charge storage layer EC in contact with the tunnel insulating layer TI, and a block insulating layer BI in contact with the charge storage layer EC are formed on the sidewalls of the trenches 77, thereby forming an ONO layer NL. Columnar portions CLmn, joint portions JPmn, and hollows H1 are formed in the trenches 77. After that, the semiconductor memory shown in FIGS. 1, 2, and 3 is manufactured by separating memory strings, and performing predetermined manufacturing steps.

Note that in this embodiment, an example in which the layers of the multilayered film ML including the eight layers, i.e., the silicon layers and silicon oxide films alternately stacked on the semiconductor substrate are collectively etched. However, the present invention is not limited to this case, and it is also possible to collectively etch layers of a multilayered film including, e.g., two layers, four layers, sixteen layers, or thirty-two layers. In addition, the present invention is not limited to a semiconductor memory in which memory cells are three-dimensionally stacked on a semiconductor substrate, and appropriately applicable as needed.

3. Effects

As described above, the semiconductor memory manufacturing method according to this embodiment achieves at least effects (1) and (2) below.

(1)-1 The Etching Rate can be Increased.

In this embodiment as described above, $C_4F_4Br_4$ is used as an etching gas in the step of collectively etching, by supplying the etching gas, the layers of the multilayered film including the silicon layers and silicon oxide films alternately stacked on the semiconductor substrate. In a plasma ambient in the etching step, cyclic halogenated carbide-based gas $C_4F_4Br_4$ is readily dissociated to generate two halogenated carbide-based molecules containing a double bond shown in FIGS. 6A and 6B. These halogenated carbide-based molecules readily form a polymer on the surfaces of the etching base materials (silicon oxide ($SiO_2$) and polysilicon (poly-Si)).

As shown in FIGS. 7, 8, 9, and 10 and in equations (1) and (2), therefore, halogens (F and Br) contained in the polymer can react with the base material ($SiO_2$ or poly-Si) of any of the insulating films (the silicon oxide ($SiO_2$) films 31a to 31h and 33 and the polysilicon (poly-Si) layers 32a to 32h) as the etching materials, thereby advancing the etching.

The energy of ions entering the semiconductor substrate in the etching step is 100 eV or more. Accordingly, even a silicon oxide film ($SiO_2$) having a strong Si—O bond can be cut, so the layers of the multilayered film ML can collectively be etched without changing the etching conditions.

The addition ratio of Br to F is 0.5 (inclusive) to 3.0 (inclusive) ($0.5 \leqq F/Br \leqq 3.0$). Since a region in which the addition ratio of Br to F is 0.5 (inclusive) to 3.0 (inclusive), i.e., relatively low is used, the layers of the multilayered film can collectively be etched without any high selectivity (at an almost constant rate). By contrast, if a region in which the addition ratio of Br to F is relatively high (e.g., F/Br>3.0) is used, it is basically possible to etch $SiO_2$ with CF, but the etching of Si is suppressed by the deposition effect caused by CF and CBr. Therefore, it is impossible to collectively etch the layers of the multilayered film without any high selectivity (at an almost constant rate) unless the region of this embodiment is used.

As described above, the semiconductor device manufacturing method according to this embodiment can increase the reactivity to any of the insulating films (the silicon oxide ($SiO_2$) films 31a to 31h and 33 and the polysilicon (poly-Si) layers 32a to 32h) as etching materials. This makes the method advantageous in that the etching rate can be increased. In addition, the method is advantageous in that the layers of the multilayered film including the silicon oxide ($SiO_2$) films/polysilicon (poly-Si) layers can collectively be etched at high speed without any high selectivity (at an almost constant rate).

(1)-2 The Productivity can be Increased.

Furthermore, the polymer formed on the carbon film 55 by the halogenated carbide-based molecules generated by dissociation in a plasma ambient and containing a double bond functions as a protective film (by CF and CBr) of the carbon film 55. This makes it possible to reduce the plasma damage to the carbon film 55 in the etching step.

Accordingly, the height of the carbon film can be held after the etching. For example, in this embodiment, the height HP1 of the carbon film 55 after the trenches 77 are simultaneously formed by etching can be held about ⅓ (⅓ HP0) the height HP0 before the etching step. In addition, the protective film prevents twisting and bending of the carbon film 55, thereby preventing the carbon film 55 from adversely affecting the shape of the etching material.

As described above, the semiconductor device manufacturing method according to this embodiment is advantageous in that the productivity can be increased.

(2) The Method is Advantageous in Reducing the Manufacturing Cost.

In this embodiment as described above, the layers of the multilayered film including the silicon layers (poly-Si) and silicon oxide films ($SiO_2$) alternately stacked on the semiconductor substrate can collectively be etched at high speed by using a single etching gas ($C_4F_4Br_4$, $0.5 \leq F/Br \leq 3.0$) under a single reaction condition (the energy of ions entering the semiconductor substrate: 100 eV or more).

This is advantageous in reducing the manufacturing cost.

This merit is large in, e.g., a semiconductor memory in which memory cells are three-dimensionally stacked on a semiconductor substrate as in this embodiment, because the number of stacked layers is as large as, e.g., eight or sixteen.

[Modifications]

The above embodiment has been explained by taking $C_4F_4Br_4$ as an example of the etching gas. However, the etching gas is not limited to this, and it is also possible to apply any gas containing at least two types of group-VII elements and a group-III, group-IV, group-V, or group-VI element in the same manner as in the above-mentioned embodiment, and obtain the same effects as effects (1) and (2) described above. For example, any of various gases presented below is applicable as the etching gas.

<Other Examples of Etching Gas>

A halogenated carbide-based gas as an etching gas containing at least two types of the group-VII elements and the group-IV element.

The halogenated carbide-based gas is a compound gas selected from a saturated cyclic halogenated carbon compound and unsaturated cyclic halogenated carbon compound. The halogenated carbide-based gas is a $C_xF_y\alpha_z$-based gas wherein $\alpha$ is one of Cl, Br, I, and At, and $y+z \leq 2x+2$.

The halogenated carbide-based gas is $C_4F_x\alpha_y$ wherein $\alpha$ is one of Cl, Br, I, and At, and $x+y=8$.

A halogenated silicide-based gas as a gas containing at least two types of the group-VII elements and the group-IV element.

A halogenated boride-based gas as a gas containing at least two types of the group-VII elements and the group-III element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising collectively etching layers of a multilayered film including silicon layers and silicon oxide films alternately stacked on a semiconductor substrate without changing the etching conditions,
    wherein an etching gas of the etching contains at least two types of group-VII elements and a group-IV element,
    an energy of ions entering the semiconductor substrate when performing the etching is not less than 100 eV,
    the at least two types of group-VII elements include F and another group-VII element other than F,
    a ratio of F in the etching gas to the another group-VII element in the etching gas is 0.5 (inclusive) to 3.0 (inclusive), and
    a ratio of F in the etching gas to the group-IV element in the etching gas is 0.5 (inclusive) to 3.0 (inclusive).

2. The method of claim 1, wherein the etching gas containing the at least two types of the group-VII elements and the group-IV element is a halogenated carbide-based gas.

3. The method of claim 2, wherein the halogenated carbide-based gas is a compound gas selected from the group consisting of a saturated cyclic halogenated carbon compound and an unsaturated cyclic halogenated carbon compound.

4. The method of claim 2, wherein the halogenated carbide-based gas is a $C_xF_yBr_z$-based gas and $y+z \leq 2x+2$.

5. The method of claim 2, wherein the halogenated carbide-based gas is $C_xF_yBr_z$ and $y+z=8$.

6. The method of claim 1, wherein the another group-VII element other than F in the etching gas is Br, and the group-IV element in the etching gas is C.

7. A method of manufacturing a semiconductor device in which memory cells are three-dimensionally stacked on a semiconductor substrate, comprising collectively etching layers of a multilayered film including silicon layers and silicon oxide films alternately stacked on a semiconductor substrate without changing the etching conditions,
    wherein an etching gas of the etching contains at least two types of group-VII elements and a group-IV element,
    an energy of ions entering the semiconductor substrate when performing the etching is not less than 100 eV,
    the at least two types of the group-VII elements include F and another group-VII element other than F,
    a ratio of F in the etching gas to the another group-VII element in the etching gas is 0.5 (inclusive) to 3.0 (inclusive), and
    a ratio of F in the etching gas to the group-IV element in the etching gas is 0.5 (inclusive) to 3.0 (inclusive).

8. The method of claim 7, wherein the etching gas containing the at least two types of the group-VII elements and the group-IV element is a halogenated carbide-based gas.

9. The method of claim 8, wherein the halogenated carbide-based gas is a compound gas selected from the group consisting of a saturated cyclic halogenated carbon compound and an unsaturated cyclic halogenated carbon compound.

10. The method of claim 8, wherein the halogenated carbide-based gas is a $C_xF_yBr_z$-based gas and $y+z \leq 2x+2$.

11. The method of claim 8, wherein the halogenated carbide-based gas is $C_4F_yBr_z$ and $y+z=8$.

12. A semiconductor device manufacturing method comprising collectively etching layers of a multilayered film including silicon layers and silicon oxide films alternately stacked on a semiconductor substrate without changing the etching conditions, wherein an energy of ions entering the semiconductor substrate when performing the etching is not less than 100 eV, and performing the etching comprising using an etching gas containing a $C_xF_yBr_z$ based gas and $y+z<2x+2$.

13. The method of claim 12, wherein the $C_xF_yBr_z$ based gas satisfies $x+y=8$.

14. The method of claim 12, wherein the $C_xF_yBr_z$ based gas is a saturated cyclic halogenated carbon compound.

* * * * *